(12) United States Patent
Lan et al.

(10) Patent No.: US 8,278,680 B2
(45) Date of Patent: Oct. 2, 2012

(54) SEMICONDUCTOR PACKAGE STRUCTURE

(75) Inventors: Pei-Hsuan Lan, Banciao (TW); Che-Feng Huang, Taoyuan (TW)

(73) Assignee: Forward Electronics Co., Ltd., Taipei (TW)

( * ) Notice: Subject to any disclaimer, the term of this patent is extended or adjusted under 35 U.S.C. 154(b) by 237 days.

(21) Appl. No.: 12/662,820

(22) Filed: May 5, 2010

(65) Prior Publication Data
US 2011/0186898 A1     Aug. 4, 2011

(30) Foreign Application Priority Data
Feb. 2, 2010 (TW) ................................ 99102978 A

(51) Int. Cl.
*H01L 33/00* (2010.01)
(52) U.S. Cl. .................................. 257/99; 257/E33.066
(58) Field of Classification Search .................... 438/26, 438/121, 42; 257/E21.51, 99, E33.066
See application file for complete search history.

(56) References Cited

U.S. PATENT DOCUMENTS
2007/0014523 A1 * 1/2007 Ohtsu et al. ...................... 385/89
2011/0101399 A1 * 5/2011 Suehiro et al. .................. 257/98

FOREIGN PATENT DOCUMENTS
WO          9726616      * 9/1997

* cited by examiner

*Primary Examiner* — Caridad Everhart
(74) *Attorney, Agent, or Firm* — Bacon & Thomas, PLLC

(57) ABSTRACT

A semiconductor package structure includes a bowl-like carrier, a semiconductor component, and electrode pins. The semiconductor component is disposed on the bowl-like carrier and is received in an accommodating recess of the bowl-like carrier. The electrode pins are electrically connected with the semiconductor component through wires. Channels are recessed along recess-walls of the accommodating recess and located between the semiconductor component and the electrode pins, where the wires pass through the channels. Therefore, the length of bonding wires can be reduced, and as well the cost of the wires, let alone the wires can be protected appropriately.

5 Claims, 4 Drawing Sheets

SEMICONDUCTOR PACKAGE STRUCTURE

BACKGROUND OF THE INVENTION

1. Field of the Invention

The present invention relates to a package structure, and more particularly, to a package structure adapted for semiconductor components, such as integrated circuits (ICs) or light emitting diodes (LEDs).

2. Description of Related Art

Generally speaking, LEDs have merits on several aspects including long life of use, small size, high vibration resistance, less heat give out, and low power consumption. Therefore, LEDs have been widely applied to household electric appliances and to indicators or light sources of various instruments. In recent years, owing to LEDs' development toward multi-colors and high brightness, LEDs have expanded their range of applications to mobile electronic products as a backlight source for small-size displays. As such, LEDs have become a new lighting source in terms of power saving and environmental protection.

Referring to FIG. 1, a schematic view illustrating part of a conventional LED package structure, the LED package structure comprises a bowl-like carrier 1, an LED chip 2 such as a blue-light or red-light LED chip, a positive-electrode pin 3, a negative-electrode pin 4, and a lens layer 8. The LED chip 2 is fixed in a bowl-like recess 5 defined in the bowl-like carrier 1.

Also, the LED chip 2 is electrically connected, respectively, with the positive-electrode pin 3 and the negative-electrode pin 4 through two wires 7. The lens layer 8 encapsulates the LED chip 2, the wires 7, and part of the positive-electrode pin 3 and of the negative-electrode pin 4.

As far as the conventional LED package structure is concerned, the bowl-like recess 5 has an integrally-annular recess-wall 6. As such, in proceeding with wirebonding to the wires 7, the wires 7 need to crossover the recess-wall 6 so as to connect with the LED chip 2 and the pins 3,4 corresponding thereto.

SUMMARY OF THE INVENTION

An object of the present invention is to provide a semiconductor package structure, so that the length of wires required to connect semiconductor components in the package structure with external pins can be shortened and thus cost be saved, and that the wires, prior to formation of a protecting layer, can obtain a preferable protection. The semiconductor package structure, according to the present invention, has merits in reducing damage to the wires resulted from shrinkage of colloid when curing thereof, in case the protecting layer is made of LED lens colloid material.

The semiconductor package structure, according to the present invention, comprises a bowl-like carrier, a semiconductor component, and electrode pins. The bowl-like carrier defines an accommodating recess, and that the semiconductor component is disposed on the bowl-like carrier and received in the accommodating recess.

The electrode pins are electrically connected with the semiconductor component through wires. Channels are recessed along recess-walls of the accommodating recess and located between the semiconductor component and the electrode pins, where the wires pass through the channels.

The semiconductor package structure, according to the present invention, not only reduces the length of gold wires used, but also lowers the extent of difficulty in wirebonding where the gold wires crossover the recess-walls of the accommodating recess. Therefore, the gold wires are under appropriate protection, so that arc of the wires will be prevented from being pressed or broken due to unintentional touch resulted from human errors or facility defects in a subsequent packaging process.

The bowl-like carrier consists of a metallic loading portion and an insulating frame, where the semiconductor component is disposed on the metallic loading portion and the insulating frame defines the accommodating recess.

According to the present invention, the electrode pins may, or may not, extend out of sides of the insulating frame. The metallic loading portion and the electrode pins may be made of the same material and originated from the same metallic material film. The metallic loading portion may include at least one auxiliary fixing hole, and that the insulating frame partly fills the auxiliary fixing hole so as to reinforce bonding of the metallic loading portion and the insulating frame.

The electrode pins may each include a concave for receiving a Zener diode. The semiconductor component may refer to an LED chip or an IC chip.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
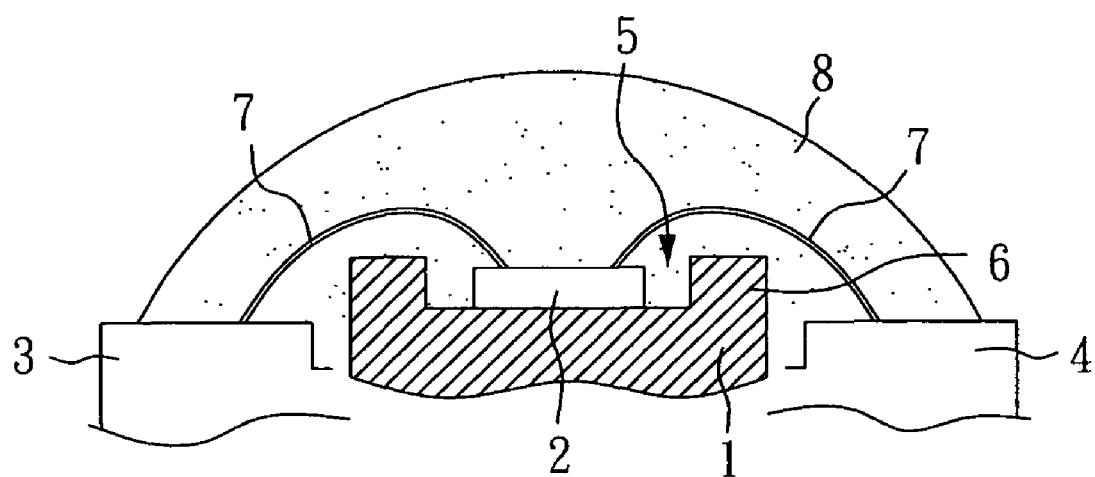
FIG. 1 is a schematic view illustrating part of a conventional LED package structure.
Figure 2:
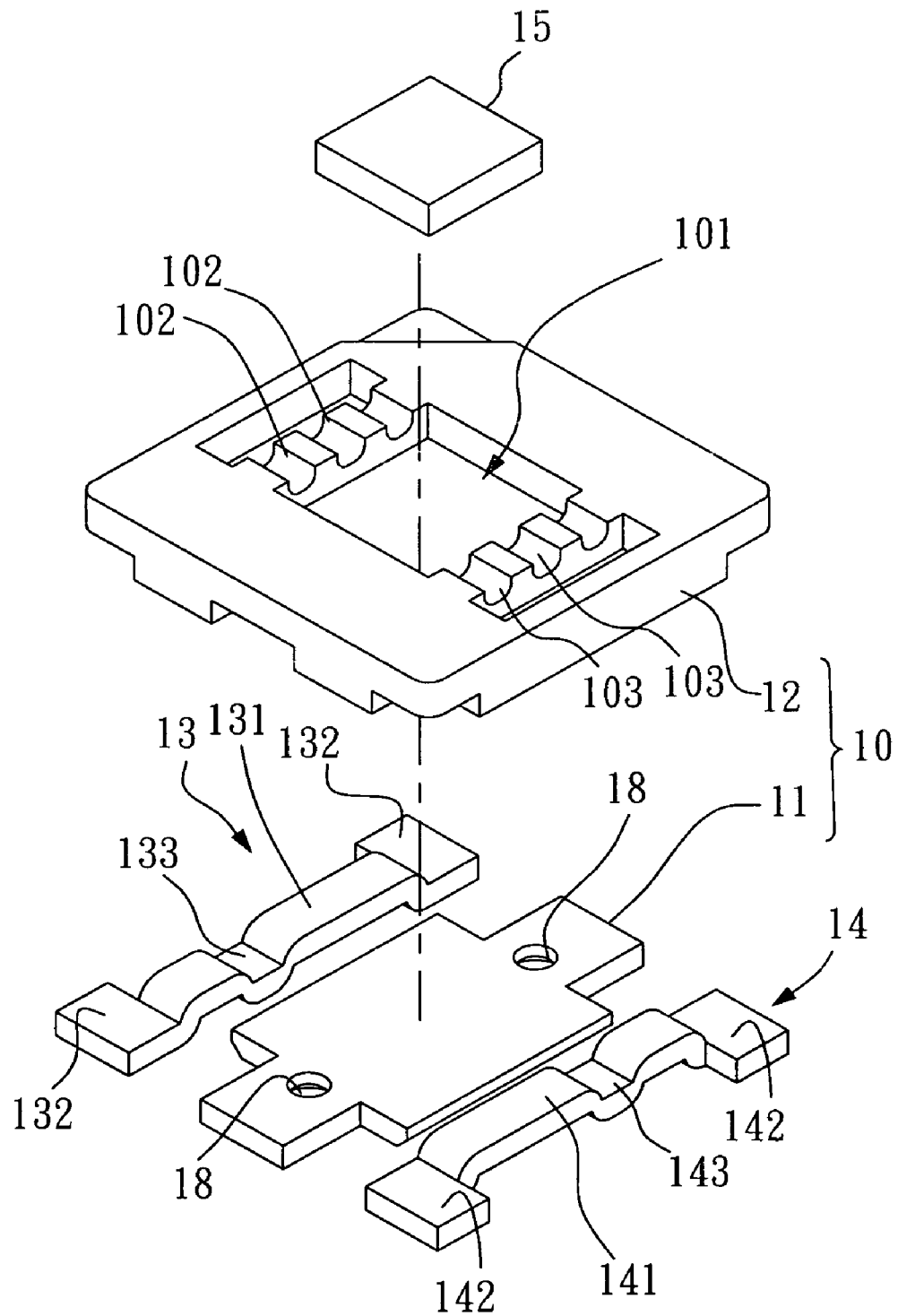
FIG. 2 is an exploded view illustrating a semiconductor package structure according to a first embodiment of the present invention.
Figure 3:
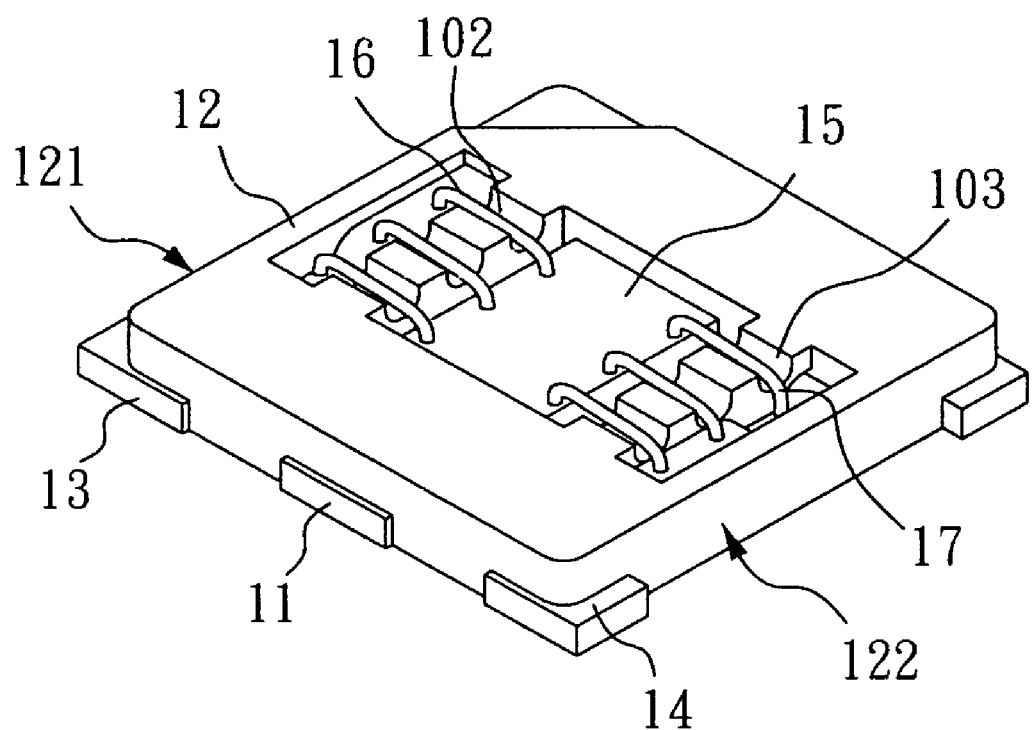
FIG. 3 is a perspective view illustrating the semiconductor package structure according to the first embodiment of the present invention.

Referring to FIGS. 2 and 3, an exploded view and a perspective view illustrating a semiconductor package structure according to a first embodiment of the present invention, the semiconductor package structure comprises a bowl-like carrier 10, a positive-electrode pin 13, a negative-electrode pin 14, and a semiconductor component 15. The bowl-like carrier 10 consists of a metallic loading portion 11 and an insulating frame (roughly quadrangle) 12. In the present embodiment, the semiconductor component 15 refers to an LED chip.

The metallic loading portion 11, the positive-electrode pin 13 and the negative-electrode pin 14 are formed by punching and originated from the same metallic material film. The positive-electrode pin 13 includes a wirebonding section 131 and two external leading sections 132 located at both sides of the wirebonding section 131. Similarly, the negative-electrode pin 14 includes a wirebonding section 141 and two external leading sections 142 located at both sides of the wirebonding section 141.

The insulating frame 12 takes the same metallic material film consisting of the metallic loading portion 11, the positive-electrode pin 13 and the negative-electrode pin 14 as a skeleton, such that the insulating frame 12 encapsulates the metallic loading portion 11 and the electrode pins 13,14 through a measure of injection molding. Besides, the insulating frame 12 is formed with an accommodating recess 101.

There are three channels 102,103 recessed, respectively, at opposite sides and along recess-walls of the accommodating recess 101, and located between the semiconductor component 15 and the electrode pins 13,14.

According to the present invention, the external leading sections 132 of the positive-electrode pin 13 and the external leading sections 142 of the negative-electrode pin 14 extend, respectively, out of two opposite sides 121,122 of the insulating frame 12, as shown in FIG. 3.

The semiconductor component 15 is electrically connected with the external leading sections 132 of the positive-electrode pin 13 and the external leading sections 142 of the negative-electrode pin 14, respectively, through wires (normally gold wires) 16,17.

The process in manufacturing a package structure of the semiconductor component is described as follows: First, to proceed with an LED die-bonding step after the injection-molding step, namely, securing the semiconductor component (LED chip) 15 in the metallic loading portion 11 and inside the accommodating recess 101. Then, a wirebonding step is proceeded by electrically connecting the semiconductor component 15 with the electrode pins 13,14 through the wires 16,17.

After finishing the wirebonding step, the wires 16,17 are positioned in the channels 102,103, so that the wires 16,17 are under protection. Therefore, arc of the wires 16,17 will not be easily pressed or broken due to unintentional touch resulted from human errors or facility defects in the subsequent manufacturing process. Further, because the wires 16,17 pass through the channels 102,103 directly, unlike the conventional art where the wires 7 need to crossover the recess-wall 6 of the bowl-like recess 5, the length of gold wires used is significantly reduced. And because the work of wirebonding, according to the present embodiment, needs not crossover the recess-walls of the accommodating recess 101, less difficulty in wirebonding is encountered as compared with the conventional art, let alone yield of products can also be raised.

It should be noted that according to the present embodiment, the metallic loading portion 11 is provided with two auxiliary fixing holes 18, such that when the insulating frame 12 encapsulates the metallic loading portion 11 through injection molding, the auxiliary fixing holes 18 can be filled with injection molding material, making the insulating frame 12 and the metallic loading portion 11 bonded together more securely. Besides, concaves 133,143 are formed, by punching, on the wirebonding section 131 of the positive-electrode pin 13 and the wirebonding section 141 of the negative-electrode pin 14 for receiving Zener diodes (not shown).

The LEDs applied in the present embodiment are adapted for various light sources, such as indoor decoration lighting, indoor auxiliary lighting, outdoor landscape lighting, street lighting, indicator lights, advertising sign lighting tubes, displays, and so forth.

Normally, in consideration of thermal conducting effect, the metallic loading portion 11 prefers adopting metals of desirable thermal conductivity, such as, iron, aluminum, or copper.

Figure 4:
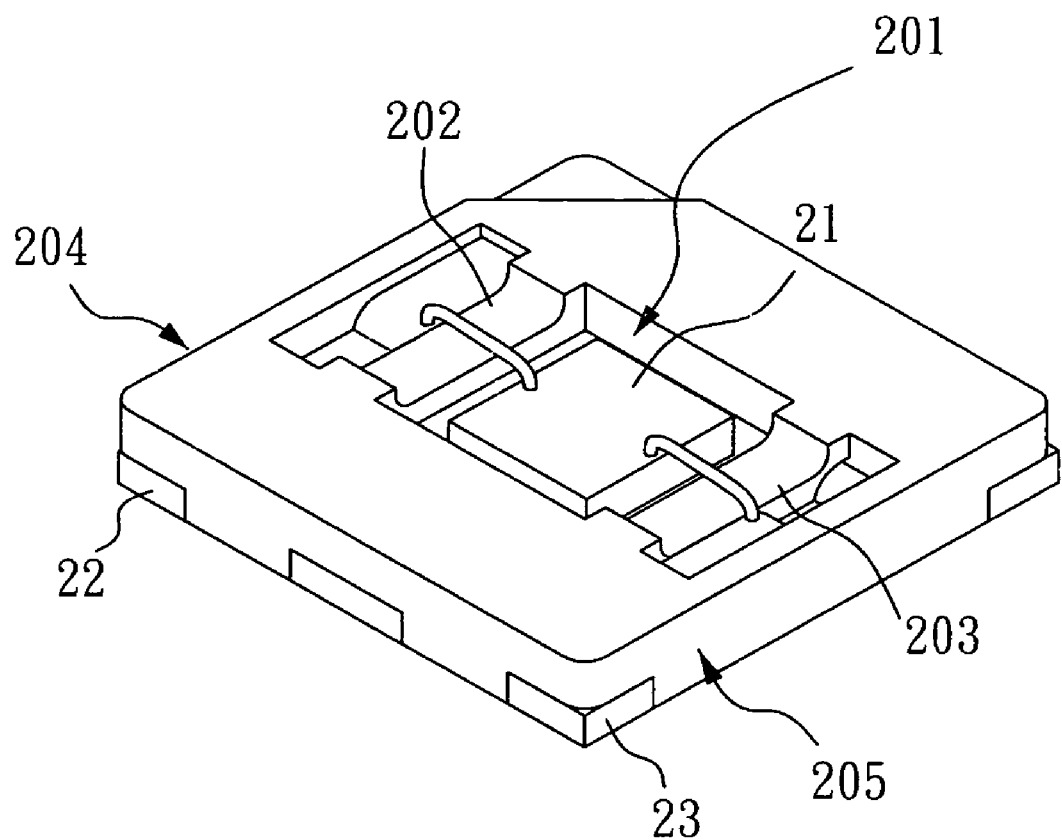
FIG. 4 is a perspective view illustrating a semiconductor package structure according to a second embodiment of the present invention.

Now referring to FIG. 4, a perspective view illustrating a semiconductor package structure according to a second embodiment of the present invention, the present embodiment is directed to an IC package structure, where a semiconductor component 21 relates to an IC chip, and channels 202,203 are each arranged at one of the opposite sides of an accommodating recess 201 on an insulating frame; and where positive-electrode external leading sections 22 and negative-electrode external leading sections 23 do not extend out of two sides 204,205 of the insulating frame.

Although the present invention has been explained in relation to its preferred embodiments, it is to be understood that many other possible modifications and variations can be made without departing from the scope of the invention as hereinafter claimed.

What is claimed is:

1. A semiconductor package structure, comprising:
a bowl-like carrier, defining an accommodating recess;
a semiconductor component, being disposed on the bowl-like carrier and received in the accommodating recess; and
electrode pins, being electrically connected with the semiconductor component through wires;
characterized in that:
channels are recessed along recess-walls of the accommodating recess and located between the semiconductor component and the electrode pins, where the wires pass through the channels;
wherein the bowl-like carrier consists of a metallic loading portion and an insulating frame, where the semiconductor component is disposed on the metallic loading portion and the insulating frame defines the accommodating recess.

2. The semiconductor package structure as claimed in claim 1, wherein the electrode pins extend out of sides of the insulating frame.

3. The semiconductor package structure as claimed in claim 1, wherein the electrode pins do not extend out of sides of the insulating frame.

4. The semiconductor package structure as claimed in claim 1, wherein the metallic loading portion and the electrode pins are made of the same material.

5. The semiconductor package structure as claimed in claim 1, wherein the metallic loading portion includes at least one auxiliary fixing hole, and the insulating frame partly fills the auxiliary fixing hole.

* * * * *